United States Patent
Kanehara et al.

(10) Patent No.: US 10,090,630 B2
(45) Date of Patent: Oct. 2, 2018

(54) LASER IGNITION DEVICE PROVIDED WITH TRANSMISSIVE REFLECTIVE FILM

(71) Applicants: DENSO CORPORATION, Kariya, Aichi-pref. (JP); INTER-UNIVERSITY RESEARCH INSTITUTE CORPORATION NATIONAL INSTITUTES OF NATURAL SCIENCES, Mitaka-shi, Tokyo (JP)

(72) Inventors: Kenji Kanehara, Nishio (JP); Akimitsu Sugiura, Kariya (JP); Takunori Taira, Tokyo (JP)

(73) Assignees: DENSO CORPORATION, Kariya (JP); INTER-UNIVERSITY RESEARCH INSTITUTE CORPORATION NATIONAL INSTITUTES OF NATURAL SCIENCES, Tokyo (JP)

( * ) Notice: Subject to any disclaimer, the term of this patent is extended or adjusted under 35 U.S.C. 154(b) by 252 days.

(21) Appl. No.: 15/123,327

(22) PCT Filed: Mar. 4, 2015

(86) PCT No.: PCT/JP2015/056394
§ 371 (c)(1),
(2) Date: Sep. 2, 2016

(87) PCT Pub. No.: WO2015/133533
PCT Pub. Date: Sep. 11, 2015

(65) Prior Publication Data
US 2017/0107966 A1 Apr. 20, 2017

(30) Foreign Application Priority Data
Mar. 4, 2014 (JP) .................................. 2014-041804

(51) Int. Cl.
*H01S 3/113* (2006.01)
*H01S 3/06* (2006.01)
(Continued)

(52) U.S. Cl.
CPC ............ *H01S 3/0625* (2013.01); *F02P 23/04* (2013.01); *G02B 6/4296* (2013.01);
(Continued)

(58) Field of Classification Search
CPC ................ F02P 23/04; H01S 3/094053; H01S 3/094076; H01S 3/09415; H01S 3/1115;
(Continued)

(56) References Cited

U.S. PATENT DOCUMENTS

| 5,883,915 A | 3/1999 | Kortz |
| 2009/0251697 A1 | 10/2009 | Cutillas et al. |

(Continued)

FOREIGN PATENT DOCUMENTS

| JP | 7-86668 | 3/1995 |
| JP | 11-223797 | 8/1999 |

(Continued)

OTHER PUBLICATIONS

English translation of International Search Report dated May 26, 2015, issued in Japanese Application No. PCT/JP2015/056394 (2 pages).

(Continued)

*Primary Examiner* — Kinam Park
(74) *Attorney, Agent, or Firm* — Nixon & Vanderhye P.C.

(57) ABSTRACT

A laser ignition device capable of achieving stable ignition, preventing deterioration of a semiconductor laser element is provided, by suppressing the intensity of oscillated light leakage leaking towards semiconductor laser side from the laser resonator with a simple configuration. A laser ignition device 7 includes an excitation light source 1 emitting
(Continued)

coherent excitation light $L_{PMP}$, an optical element 2 transmitting excitation light $L_{PMP}$, a laser resonator 3 oscillating oscillated light having high energy density by being irradiated with excitation light $L_{PMP}$, and condensing means 6 condensing the oscillated light $L_{PLS}$ oscillated by the laser resonator 3. Moreover, the laser ignition device 7 is provided with a light-transmissive-reflective film 5 disposed between the excitation light source 1 and the laser resonator 3. The light-transmissive-reflective film 5 permeating the excitation light $L_{PMP}$ having short wavelength and reflecting oscillated light leakage $L_{LEAK}$ having long wavelength.

7 Claims, 12 Drawing Sheets

(51) Int. Cl.

| | |
|---|---|
| *F02P 23/04* | (2006.01) |
| *G02B 6/42* | (2006.01) |
| *H01S 3/094* | (2006.01) |
| *H01S 3/0941* | (2006.01) |
| *H01S 3/16* | (2006.01) |
| *H01S 5/00* | (2006.01) |
| *H01S 5/40* | (2006.01) |
| *H01S 3/11* | (2006.01) |
| *H01S 5/022* | (2006.01) |
| *H01S 3/02* | (2006.01) |

(52) U.S. Cl.
CPC ........ *H01S 3/0621* (2013.01); *H01S 3/09415* (2013.01); *H01S 3/094053* (2013.01); *H01S 3/094076* (2013.01); *H01S 3/1115* (2013.01); *H01S 3/1611* (2013.01); *H01S 3/1643* (2013.01); *H01S 5/0064* (2013.01); *H01S 5/4012* (2013.01); *H01S 5/4025* (2013.01); *H01S 3/025* (2013.01); *H01S 3/0627* (2013.01); *H01S 3/113* (2013.01); *H01S 5/02252* (2013.01); *H01S 5/02284* (2013.01); *H01S 5/405* (2013.01)

(58) Field of Classification Search
CPC ...... H01S 3/1611; H01S 3/1643; H01S 3/025; H01S 3/0627; H01S 3/0625; H01S 3/0621; H01S 5/4012; H01S 5/4025; H01S 5/02284; H01S 5/0405
See application file for complete search history.

(56) References Cited

U.S. PATENT DOCUMENTS

| | | | |
|---|---|---|---|
| 2010/0309558 A1* | 12/2010 | Ozygus | .................. F02P 23/04 359/628 |
| 2013/0057949 A1 | 3/2013 | Nakai et al. | |
| 2013/0163624 A1 | 6/2013 | Miyanaga et al. | |
| 2013/0186362 A1* | 7/2013 | Kanehara | ................ F02P 15/08 123/143 B |
| 2013/0255613 A1* | 10/2013 | Hartke | .................... F02P 23/04 123/143 B |

FOREIGN PATENT DOCUMENTS

| | | |
|---|---|---|
| JP | 2005-285807 | 10/2005 |
| JP | 2008-268847 | 11/2008 |
| JP | 2009-141362 | 6/2009 |
| JP | 2012-189044 | 10/2012 |
| JP | 2013-120799 | 6/2013 |

OTHER PUBLICATIONS

Tsunekane et al., "High Peak Power, Passively Q-switched Microlaser for Ignition of Engines", IEEE Journal of Quantum Electronics vol. 46, No. 2, pp. 277-284, Feb. 2010.

Seurin et al., "High-Power Vertical-Cavity Surface-Emitting Arrays", Proc. of SPIE, vol. 6876, p. 68760D-1-68760D-9, Jan. 19, 2008.

* cited by examiner (EXAMPLE)

(COMPARATIVE EXAMPLE)

EMITTERS HAVING DECREASED EMISSION INTENSITY

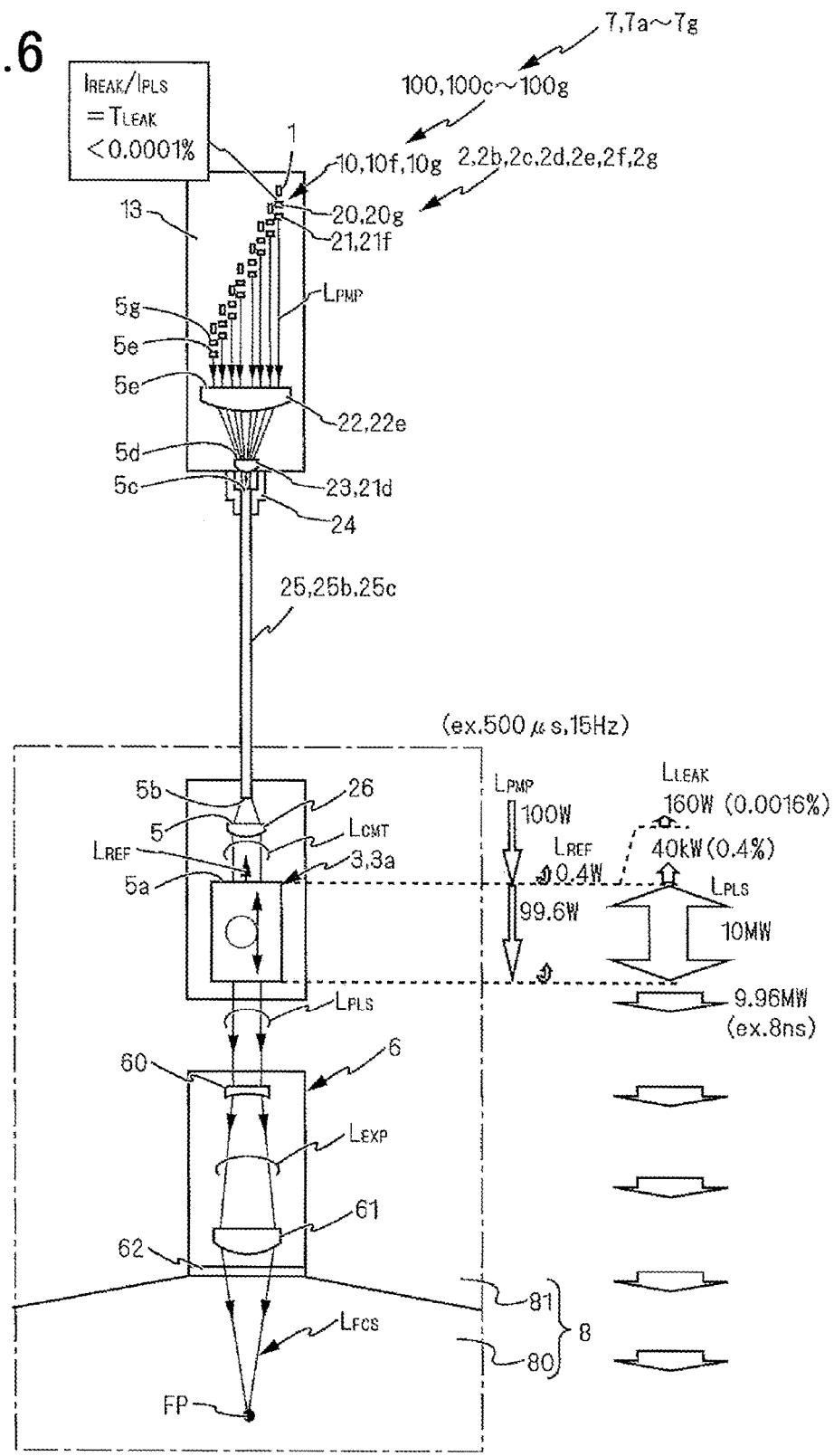

LASER IGNITION DEVICE PROVIDED WITH TRANSMISSIVE REFLECTIVE FILM

This application is the U.S. national phase of International Application No. PCT/JP2015/056394 filed on Mar. 4, 2015 which designated the U.S. and is based on and claims the benefit of priority from earlier Japanese Patent Application No. 2014-41804 filed on Mar. 4, 2014 the descriptions of each of which are incorporated herein by reference.

TECHNICAL FIELD

The present invention relates to a laser ignition device, in which a plurality of semiconductor laser devices are used as excitation light sources, transmitting a laser to a laser resonator via an optical element, thereby generating a pulse laser having high energy density, the pulse laser being condensed inside a combustion chamber of an internal combustion engine so as to ignite air-fuel mixture.

BACKGROUND ART

Various types of laser ignition devices have been considered. These laser ignition devices are used for internal combustion engines having low ignitability such as a gas fuel engine for cogeneration, a lean-burn engine or the like. Each of the laser ignition devices uses a semiconductor laser element as an excitation light source, irradiating a Q-switch laser resonator with excitation light oscillated by the semiconductor laser element to oscillate a pulse laser having high energy density. The energy density is further enhanced by using a condensing means that condenses the oscillated pulse laser in an air-fuel mixture introduced into the combustion chamber, so as to ignite the air-fuel mixture.

For example, PTL 1 discloses a laser ignition device performing ignition of an internal combustion engine, provided with a laser device including a passive Q-switch having a solid-state active laser. The solid state active laser includes a laser-active region and a laser-inactive region which are designed to have specific length.

On the other hand, in the semiconductor laser device, when light emitted from the light source of the semiconductor laser element or the like enters various optical elements, optical fibers or the like, a part of the light is reflected or scattered on an incident surface of the optical element or the optical fiber, and the light may partially return to the light source. In the case where the returning light enters an active layer of the semiconductor laser element, wavelength of the oscillation may be disturbed or the output thereof may be varied. In the worst case scenario, it has been known that the semiconductor laser element may be broken.

Therefore, according to a general semiconductor laser device, as a means for eliminating the returned light, an optical isolator is used. Specifically, a polarization dependent optical isolator which depends on a polarization state of the incident light, and a polarization independent optical isolator which does not depend on a polarization state of the incident light have been known (refer to PTLs 2 and 3).

Likewise, for the laser ignition device, by using the optical isolator, it is considered that the semiconductor laser element can be prevented from being damaged by the returned light.

CITATION LIST

Patent Literature

[PTL 1] JP-A-2009-141362
[PTL 2] JP-A-H11-223797
[PTL 3] JP-A-2008-268847

SUMMARY

Technical Problem

However, in the case where a plurality of semiconductor laser devices are used as excitation light sources in the laser ignition device so as to increase the output energy, thereby performing ignition of an internal combustion engine having low ignitability, when an optical isolator is used, as in the conventional technique, to prevent the semiconductor laser element being broken due to returned light, following problems arise.

Firstly, various optical components which compose the optical isolator are required so that manufacturing cost may increase.

Secondary, it is necessary to adjust an optical axis of the excitation light oscillated by the plurality of semiconductor laser elements to be received by the optical isolator. Hence, a mechanism or a work for adjusting the optical axis is further required, which causes a further increase of manufacturing cost.

In the laser ignition devices, a pulse laser having extremely large energy density has to be condensed. Accordingly, a semiconductor laser module composed of a plurality of semiconductor laser elements is used as an excitation light source, whereby loads of each of the semiconductor laser elements can be reduced.

In this case, when the excitation light oscillated by the plurality of semiconductor laser elements is condensed by a condenser lens, excitation light having mutually different phases are present, and each of the optical axes are different from each other. Hence, in the case where a beam of the excitation light which passed through the optical isolator are recombined similar to the beam of the original excitation light, and the returned light is emitted to the light source side, it is very difficult to adjust the ordinary light and the extraordinary light separated by the plurality of semiconductor laser elements so that they do not enter the semiconductor laser elements.

Thirdly, in the case where the optical isolator is used, intensity of the excitation light being irradiated to the laser medium may be decreased, because of a reflection loss when the excitation light enters the optical isolator and a transmission loss of optical components which compose the optical isolator.

Other than the optical isolator, since transmission loss occurs when passing through the optical components, which is not avoidable, a simple configuration is preferably used where the number of optical components is reduced as much as possible to increase an energy efficiency of the laser ignition device.

Fourthly, since the optical isolator produces Faraday effects by using a permanent magnet which applies a strong magnetic field to a Faraday rotator, a mechanism that cuts off magnetic field is required in the vicinity thereof, causing an increase in size of the laser ignition device. Therefore, recent requirements of shrinking laser ignition device may not be satisfied.

Fifthly, conventionally, it has been considered that almost no laser light leakage exists from an edge surface of excitation side of the laser resonator. However, in the case where the laser ignition requires a laser for generating a megawatt order or more of giant pulse, it has been found that light leakage from the edge surface of the excitation side cannot be ignored.

Specifically, the excitation edge surface of the microchip laser serves as a totally reflecting mirror of the resonator as well. Hence, conventionally, a transmittance of 0.1% is considered sufficient for the oscillation light, as a transmittance of the high reflection coating.

However, considering that the optical power in the resonator of the laser oscillation is 10 MW or more, even when the transmittance of the high reflection coating is 0.1%, the optical power of light leakage transmitted from the edge surface reaches 10 KW.

On the other hand, the optical power required for the excitation light of such a microchip laser is approximately 100 W, which is only 1/100 of the optical power of the light leakage of the oscillation light, even when 100% amount of the excitation light is returned.

Specifically, the light leakage of the oscillated light from the resonator, as a conventional problem of the semiconductor laser, is much larger than the returned light due to a reflection from the excitation light. Hence, there is a concern that the light leakage of the oscillated light from the resonator may directly hit the semiconductor laser device used for an excitation light source.

The semiconductor laser element is irradiated by the oscillated light leakage for extremely short period of time such as several nanoseconds. However, it was found that long-term reliability is degraded. Note that the duration where the excitation reflection light irradiates the semiconductor laser element is extremely larger than the duration where the oscillation light leakage from the laser resonator side irradiates the semiconductor laser element. In this respect, an amount of energy of the excitation reflection light is larger than that of the oscillation light leakage. However, since the electric power the excitation reflection light is small, the laser diode does not suffer any damage. However, the oscillation light leakage of which the electric power is extremely high causes a damage to the laser diode even in a very short period of time.

It should be noted that damage to the semiconductor laser element is caused by thermal reasons or light intensity (power/area) reasons. The present invention is to solve a failure caused by an increase in the power of the oscillated light leakage, the oscillated light leakage being among the light returning to the excitation light source side.

The present invention has been achieved in light of the above-mentioned circumstances and aims to provide a laser ignition device capable of preventing semiconductor laser element being deteriorated so as to accomplish stable ignition operation, by suppressing the intensity of light leakage towards the semiconductor laser device from the laser resonator with a simple configuration.

Solution to Problem

A laser ignition device (7, 7a, 7b, 7c, 7d, 7e, 7f, 7g) according to one aspect of the present disclosure is configured to ignite an air-fuel mixture introduced into a combustion chamber (80) of an internal combustion engine (8) by condensing oscillated light ($L_{FCS}$) having high energy density. The laser ignition device is characterized in that the device includes: an excitation light source (1) that emits coherent excitation light ($L_{PMP}$); an optical element (2, 2a, 2b, 2c, 2d, 2e, 2f, 2g) that transmits the excitation light emitted from the excitation light source; a laser resonator (3, 3a) that oscillates oscillated light ($L_{PLS}$) having high energy density by being irradiated with the excitation light transmitted via the optical element; and a condensing means (6) that condenses the oscillated light oscillated by the laser resonator, in which a light-transmissive-reflective film (5, 5a, 5b, 5c, 5d, 5e, 5f, 5g) is provided between the excitation light source and the laser resonator, the light-transmissive-reflective film permeating the excitation light having short wavelength and reflecting oscillated light leakage ($L_{LEAK}$) leaked from the laser resonator to an excitation light source side, the oscillated light leakage being a part of the oscillated light having long wavelength.

Advantageous Effects of Invention

Even when a part of the excitation light oscillated by resonant amplification in the laser resonator is incident as a light leakage on the excitation light source side, the light-transmissive-reflective film reflects it so that the energy of the excitation light becomes extremely small before reaching the excitation light source. Hence, the excitation light source is prevented from being damaged by the oscillated light leakage.

Further, since the light-transmissive-reflective film is provided as an extremely thin multi-layered film disposed on an end surface of the optical element, unlike the case where a conventional optical isolator is provided, increasing device size can be avoided.

Furthermore, since the light-transmissive-reflective film is formed on existing optical elements, additional optical elements are not required so that an increase of transmission energy loss can be minimized.

BRIEF DESCRIPTION OF DRAWINGS

FIG. 6 is a diagram showing an overall configuration of the laser ignition device.

DESCRIPTION OF EMBODIMENTS

Figure 1A:
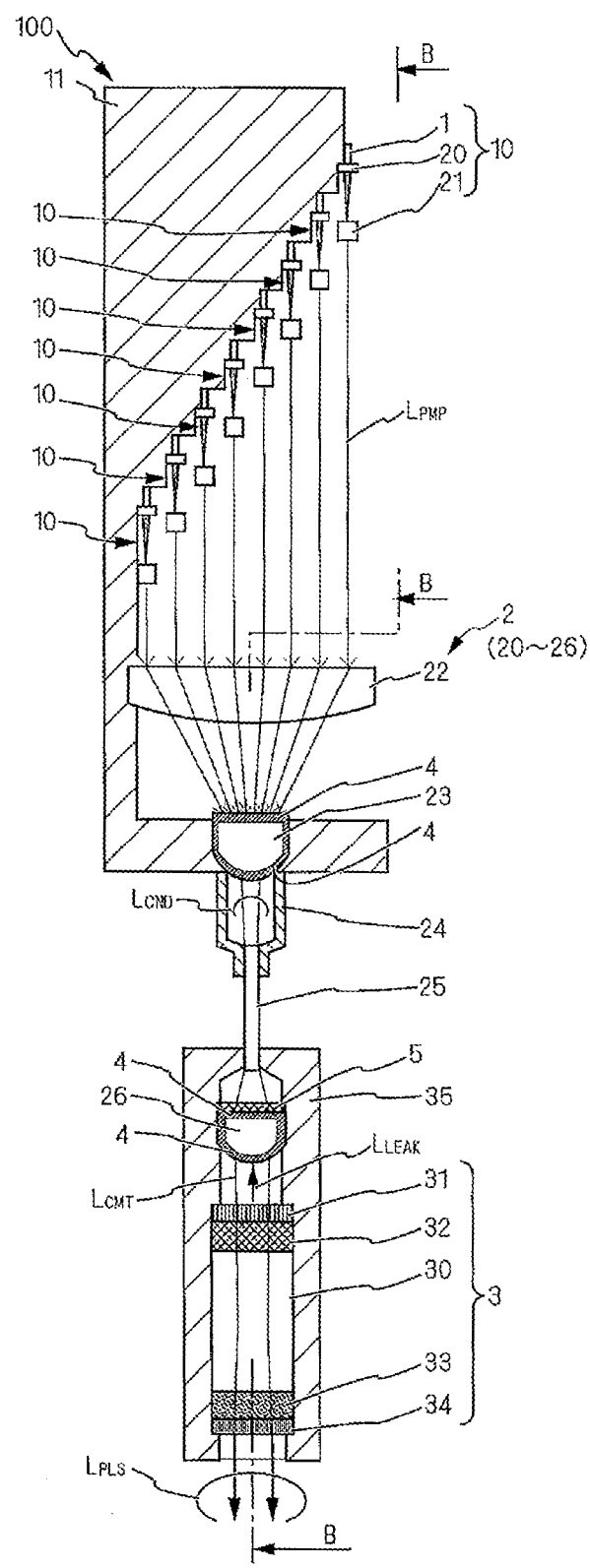
FIG. 1A is cross sectional view taken along a line A-A shown in FIG. 1B, showing an overall configuration of the major portion of a laser ignition device according to the first embodiment.

In the present disclosure, an excitation light source 1 is provided that emits coherent excitation light $L_{PMP}$, an optical element 2 that transmits excitation light emitted from the excitation light source 1, a laser resonator 3 that produces oscillated light $L_{PLS}$ having high energy density by being irradiated with an excitation light $L_{PMP}$ transmitted via the optical element 2, and a condensing means 6 that condenses the oscillated light $L_{PLS}$ oscillated by the laser resonator 3. The present disclosure relates to a laser ignition device 7 in which oscillated light $L_{FCS}$ having high energy density is condensed into the air-fuel mixture introduced inside the combustion chamber 80 of an internal combustion engine 8. In the present disclosure, a forward direction may be defined as a direction extending along an optical path which extends to the internal combustion engine 8 from the light excitation light source 1, and extending to the internal combustion engine 8, and a backward direction may be defined as a direction extending along an optical path which extends to the internal combustion engine 8 from the excitation light source 1, and extending to the excitation light source 1. An "incident side" refers to a side on which light proceeding towards the forward direction is incident, and an "emission side" refers to a side from which light proceeds to the forward direction.

Figure 1B:
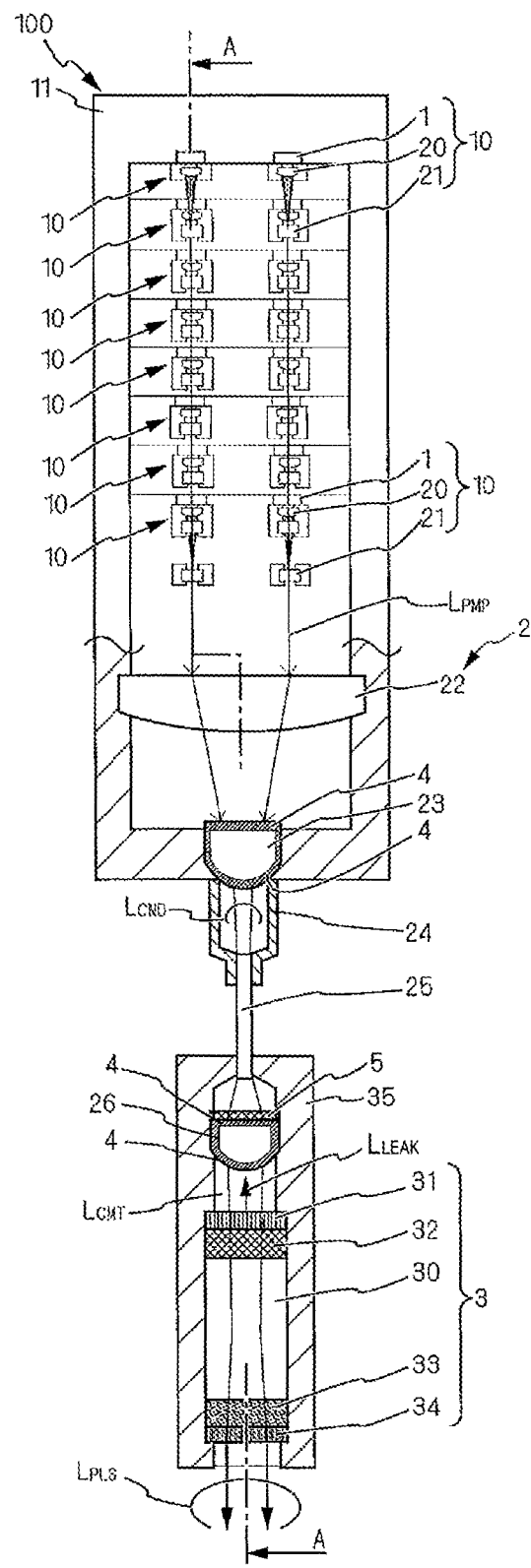
FIG. 1B is a partial cross sectional view taken along a line B-B shown in FIG. 1A.
Figure 1C:
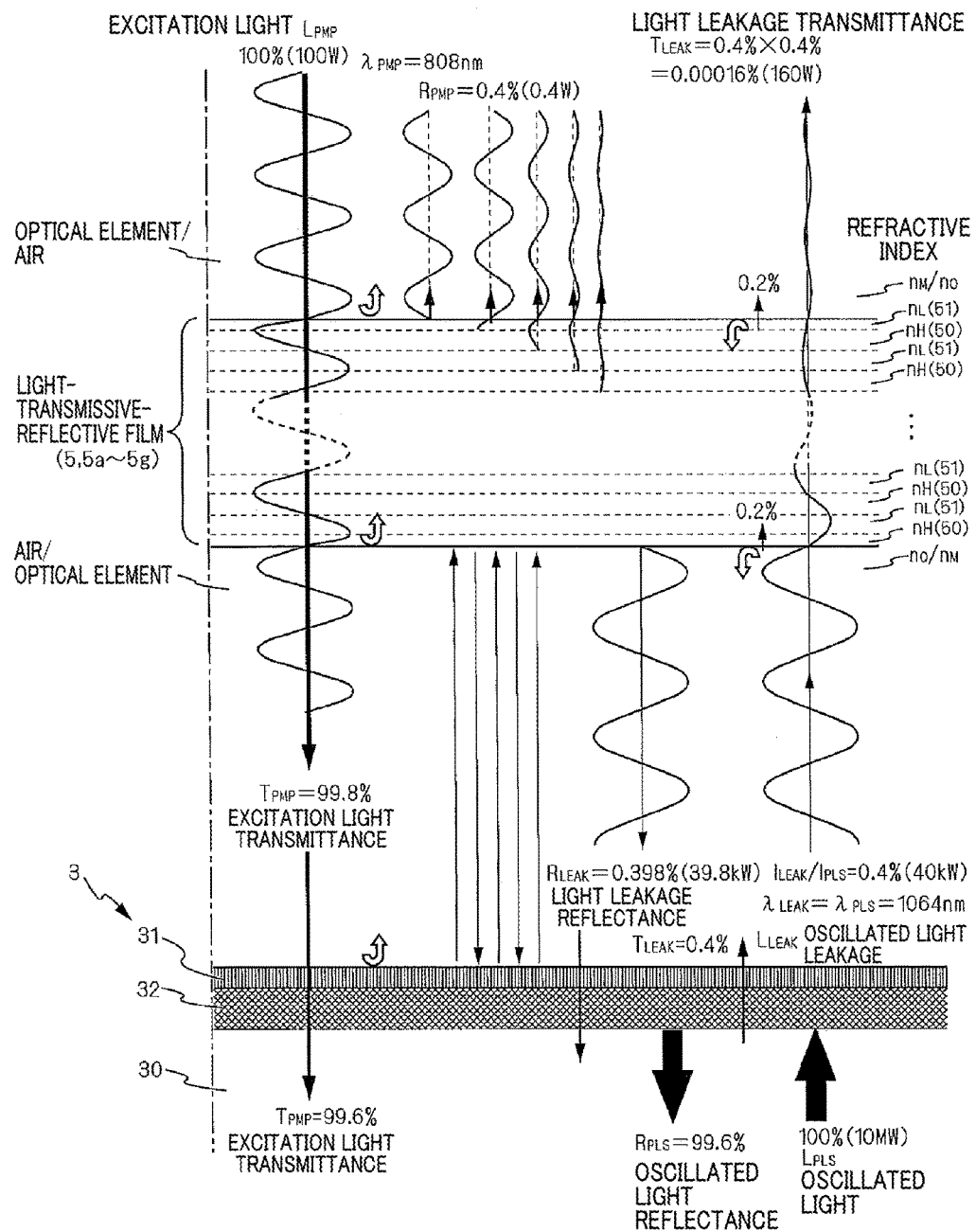
FIG. 1C is a schematic view showing effects of a light-transmissive-reflective film.

With reference to FIGS. 1A, 1B and 1C, a major portion of the laser ignition device 7 according to the first embodiment will be described. Note that the overall configuration of the laser ignition device 7 will be described later with reference to FIG. 6.

The excitation light source 1 according to the present embodiment includes a light-emission emitter composed of a semiconductor laser element, and emits coherent excitation light $L_{PMP}$ by being energized. In the present embodiment, as excitation light $L_{PMP}$, an infrared laser having a peak wavelength $\lambda_{PMP}$ of 808 nm is used, and it is exemplified that oscillated light $L_{PLS}$ having a peak wavelength $\lambda_{PLS}$ of 1064 nm is emitted from the laser resonator 3 by being irradiated with the excitation light $L_{PMP}$. The wavelength $\lambda_{PMP}$ of the excitation light $L_{PMP}$ emitted from the excitation light source 1 and the wavelength $\lambda_{PLS}$ of the oscillated light LDLs can be approximately selected.

The excitation light source 1 is provided with cylindrical lenses 20 and 21 as an optical element, which collimate the excitation light $L_{PMP}$, configuring a semiconductor laser module 10. For the cylindrical lenses 20 and 21, known optical material is used including an optical glass, a heat-resistant glass, quartz glass, and a sapphire glass. A plurality of semiconductor laser modules 10 are arranged in tiers (step) on a semiconductor laser fixing base 13.

According to the present embodiment, it is exemplified that semiconductor laser modules 10 are arranged in 2 rows, each row having 8 semiconductor laser modules 10 arrayed therein. However, the number of semiconductor laser modules is not limited.

Excitation light $L_{PMP}$, which is emitted from the plurality of semiconductor laser modules 10 and collimated, is condensed by condensing lenses 22 and 23 provided at a tip end as an optical element. For the condensing lenses 22 and 23, known optical material is used including an optical glass, a heat-resistant glass, a quartz glass, and a sapphire glass.

Each surface of the condensing lenses 22 and 23 may be covered with known antireflection coating.

Each end surface in the incident side of the condensing lenses 22 and 23 is processed to be a plane shape, and the emission surface thereof is formed as an aspherical lens.

Convergent light $L_{CND}$ focused by the condensing lenses 22 and 23 is coupled to an optical fiber 25 via a coupling element 24.

For the coupling element 24, an optical ferrule or a hollow sleeve or the like can be used. The optical ferrule is composed of known optical material such as crystallized glass, and the hollow sleeve holds an end portion of the optical fiber 25. For the optical fiber 25, a known optical fiber can be used having a numerical aperture 0.22 or less and a core diameter φ of 600 μm or less. A beam diameter of the excitation light $L_{PMP}$ irradiating the laser resonator 3 is set as φ=1200 μm.

The convergent light $L_{CND}$ transmitted via the optical fiber 25 is collimated by the collimating lens 26 to produce parallel light $L_{CMT}$ which is incident on the laser resonator 3.

For the collimating lens 26, known optical material is used including an optical glass, a heat-resistant glass, a quartz glass, and a sapphire glass.

Each end surface in the incident side of the collimating lens 26 according to the present embodiment is processed to be a plane shape, and the emission surface thereof is formed as an aspherical lens.

The convergent light $L_{CND}$, in which excitation light $L_{PMP}$ is focused, is modulated to the parallel light $L_{CMT}$.

The collimating lens 26 has an antireflection coating 4 formed on the surface thereof. Further, a light-transmissive-reflective film 5 as a major portion of the present embodiment is formed at least on the end surface in the incident side, which is formed in a plate shape. In the light-transmissive-reflective film 5 according to the present embodiment, a high refractive index film 50 made of $Ta_2O_5$ having high refractive index ($n_H$=2.16) and a low refractive index film 51 made of $SiO_2$ having low refractive index ($n_L$=1.41) are laminated alternately to form a 19-layered film.

The light-transmissive-reflective film 5 permeates 99.8% of the excitation light $L_{PMP}$ having short wavelength (e.g., $\lambda_{PMP}$=808 nm), and reflects 99.6% of the light leakage $L_{LEAK}$ of the oscillated light $L_{PLS}$ having wavelength longer than that of the excitation light $L_{PMP}$ (e.g., $\lambda_{LEAK}=\lambda_{PLS}$=1064 nm).

Further, as a translucent film 4, the high refractive index film 50 made of $Ta_2O_5$ having high refractive index ($n_H$=2.16) and the low refractive index film 51 made of $SiO_2$ having low refractive index ($n_L$=1.41) are laminated alternately on an emission surface of the collimating lens 26 to form a 4-layered film. 99.8% of the excitation light $L_{PMP}$ passes through the translucent film 4 to be emitted as the parallel light $L_{CMT}$.

For the low refractive index film 51, a dielectric substance selected from $SiO_2$ and $MgF_2$ can be used. For the high refractive index film 50, a dielectric substance selected from $TiO_2$ and $Ta_2O_5$ can be used. Multi layered film can be formed by known thin film forming methods such as vapor deposition and ion plating.

The laser resonator 3 is disposed at the front side of the collimating lens 26 in the forward direction.

For the laser resonator 3, a known passive Q-switch laser resonator can be used.

The laser resonator 3 is configured of a laser medium 30, an antireflection coating 31 provided in the incident side thereof, a totally reflecting mirror 32, a saturable absorber 33 provided in the emission side thereof, and an emission mirror 34 composed of a partial reflection film, which are accommodated in a housing 35 having cylindrical shape.

For the laser medium 30, a known laser medium is used, for example Nd:YAG, where Nd is doped to single crystal YAG.

The totally reflecting mirror 32 is formed such that the excitation light $L_{PMP}$ having short wavelength is permeated and the oscillated light $L_{PLS}$ having long wavelength is totally reflected.

For the saturable absorber 33, Cr:YAG in which $Cr^{4+}$ is doped into single crystal YAG or the like is used.

For the laser resonator 3, Nd in the laser medium 30 is excited by the excitation light $L_{PMP}$ introduced in the resonator to emit light having a wavelength of 1064 nm, and the emitted light is accumulated in the laser medium 30.

The oscillated light $L_{PLS}$ oscillates from an output mirror 34 when an energy level in the laser medium 30 reaches a prescribed level.

At this moment, from the incident surface of the totally reflecting mirror 32 in the back surface side, approximately 0.4% of the intensity of the oscillated light $L_{PLS}$ is inevitably propagated to the excitation light source 1 side as the oscillated light leakage $L_{LEAK}$.

According to the present embodiment, when the oscillated light leakage $L_{LEAK}$ having approximately 0.4% of the intensity of the oscillated light $L_{PLS}$ reaches the end surface in the incident surface side of the collimating lens 26, the light-transmissive-reflective film 5 formed on the surface thereof reflects 99.8% of the oscillated light leakage $L_{LEAK}$, the reflected light leakage $L_{LEAK}$ returns to the laser resonator 3 side, and 0.2% of the oscillated light leakage $L_{LEAK}$ is permeated to the excitation light source side. Also, on the end surface in the emission side of the collimating lens 26, 0.2% of the oscillated light leakage $L_{LEAK}$, which is reflected at the light-transmissive-reflective film 5, is reflected to the excitation light source side.

While the oscillated light leakage $L_{LEAK}$ is reflected and permeated multiple times (e.g., approximately 3 ns duration) between the incident surface of the laser resonator 3 and the light-transmissive-reflective film 5 as a major portion of the present embodiment, the oscillated light leakage $L_{LEAK}$ disappears.

As a result, even if the 0.4% of the intensity of the oscillated light $L_{PLS}$ is leaked to the excitation light source side from the laser resonator 3, 99.6% of the leaked oscillated light is cut off by the light-transmissive-reflective film 5. Therefore, 0.4% of the oscillated light leakage $L_{LEAK}$, i.e., up to 0.0016% of the intensity of the oscillated light $L_{PLS}$, leaks, and so the intensity of the oscillated leakage light $L_{LEAK}$ transmitted to the excitation light source 1 side can be suppressed.

Thus, even if the oscillation light $L_{PLS}$ having power extremely larger than that of the excitation light $L_{PMP}$ is partially leaked, the power of the oscillated light leakage $L_{LEAK}$ is reduced to an amount of power similar to that of the reflected light of the excitation light $L_{PMP}$. Accordingly, in the case where the light leakage $L_{LEAK}$ reaches the excitation light source 1, the semiconductor laser element is not damaged.

As a specific example, FIG. 1C illustrates an example where the excitation light $L_{PMP}$ having wavelength $\lambda_{PMP}$ of 808 nm is introduced to the laser resonator 3 at 100 watt of power, and an oscillated light leakage transmittance $T_{LEAK}$ is calculated when the oscillated light $L_{PLS}$ having 1064 nm of wavelength $\lambda_{PLS}$ is emitted at 10 MW of power. It should be noted that the power of the oscillated light $L_{PLS}$ is not limited to the above-mentioned value in the laser ignition device according to the present invention.

A simulation can be applied for the light-transmissive-reflective film 5 using Snell's law, Fresnel's formula and Maxwell equation to appropriately obtain combinations of conditions which accomplish high transmittance $T_{PMP}$ of the excitation light $L_{PMP}$ and high reflectance $R_{LEAK}$ of the light leakage $L_{LEAK}$. The conditions include a refractive index $n_H$ of the high refractive index film 50 and the film thickness $d_H$ thereof, a refractive index $n_L$ of the low refractive index film 51 and the film thickness $d_L$ thereof, wavelength $\lambda_{PMP}$ of the excitation light $L_{PMP}$ and wavelength $\lambda_{PLS}$ of the oscillated light $L_{PLS}$, i.e., wavelength $\lambda_{LEAK}$ of the oscillated light leakage $L_{LEAK}$.

Theoretically, conditions where 100% amount of the excitation light $L_{PMP}$ is permeated and 100% of the oscillated light leakage $L_{LEAK}$ is reflected can be calculated. However, practically, as described in the embodiment, the transmittance $T_{PMP}$ of the excitation light $L_{PMP}$ is approximately 99.8% and the reflectance $R_{LEAK}$ of the oscillated light leakage $L_{LEAK}$ is approximately 99.6%, i.e., the transmittance $T_{LEAK}$ of the oscillated light leakage $L_{LEAK}$ is approximately 0.4%.

Hence, as in the present embodiment, the light-transmissive-reflective film 5 is provided with a totally reflecting film 32 of the laser resonator 3 to be overlapped from each other, whereby the oscillated light leakage $L_{LEAK}$ as a part of the oscillated light $L_{PLS}$ is reciprocally transmitted between the light-transmissive-reflective film 5 and the laser resonator 3 so as to cutoff 99.5% amount of light leakage $L_{LEAK}$ propagating to the excitation light source 1 side from a partial reflection film 31, the oscillated light leakage $L_{LEAK}$ corresponding to 0.4% amount of the intensity of the oscillated light $L_{PLS}$. As a result, the oscillated light leakage $L_{LEAK}$ can be approximately 0.0016% amount of the oscillated light leakage $L_{PLS}$.

Figure 2:
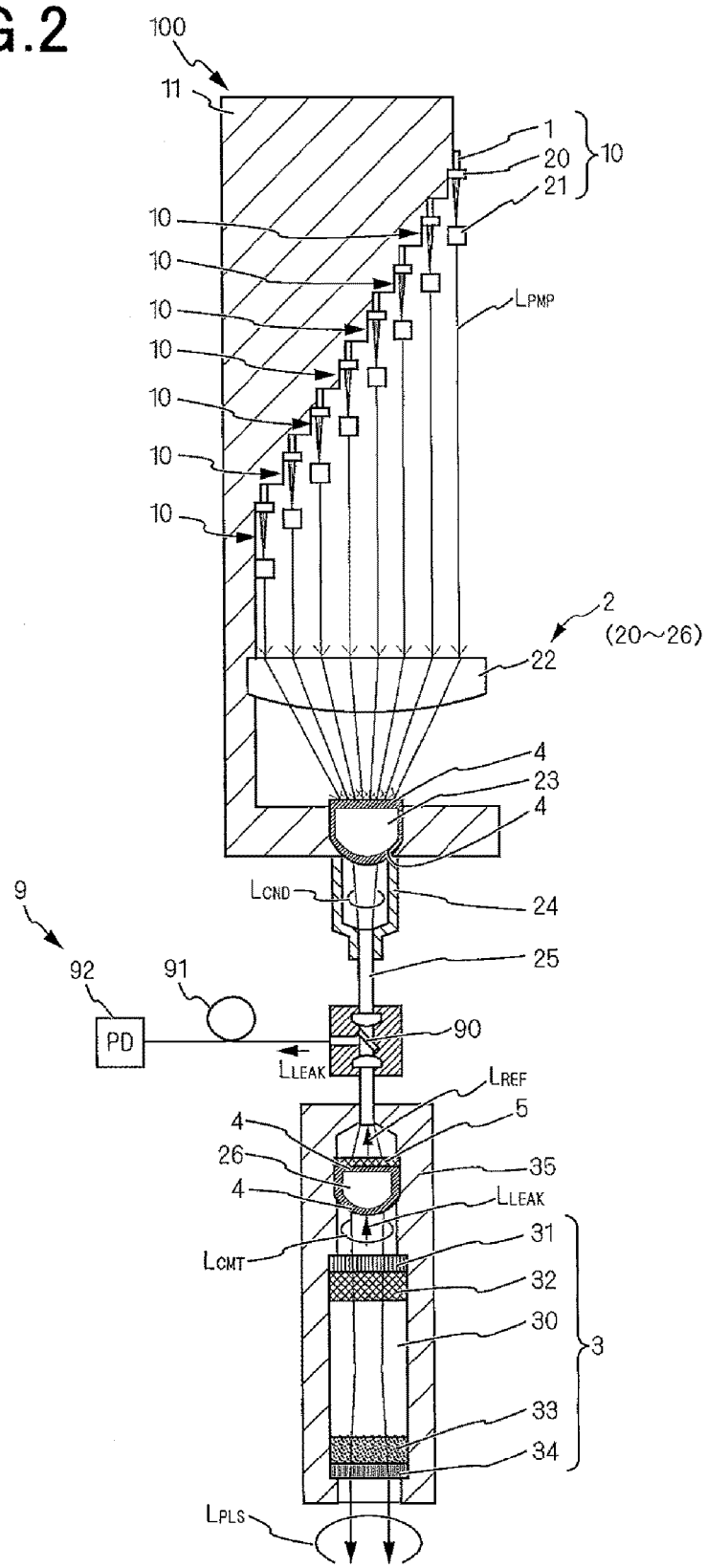
FIG. 2 is a cross sectional view showing a verification method for confirming effects of the present embodiment.

With reference to FIG. 2, hereinafter a method of verification will be described, the verification being applied to effects of suppression of the oscillated light leakage according to the present invention.

The above-described semiconductor laser module 100 and the laser resonator 3 are connected, and a beam splitter 90 which totally reflects light having wavelength of 1064 nm is disposed in the middle of the optical fiber 25 which transmits the excitation light $L_{PMP}$. A photodetector 92 detects intensity of the oscillated light leakage $L_{LEAK}$ via the optical fiber 91.

A comparison example was provided in which the light-transmissive-reflective film 5 according to the present embodiment is not formed. The effects of the present embodiment were verified by comparing the comparison example with an example 1 in which the light-transmissive-reflective film 5 is formed on a plane part of the collimating lens 26.

Figure 3A:
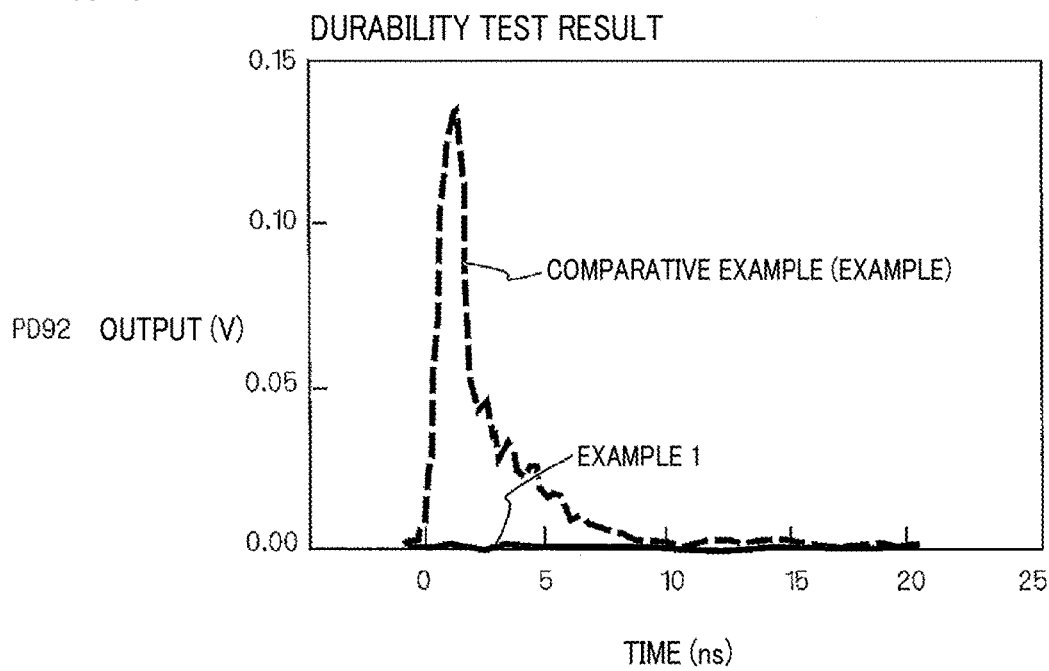
FIG. 3A is a characteristics diagram showing effects of suppression of the oscillated light leakage according to the present embodiment together with a comparative example.

As a result, as shown in FIG. 3A, the intensity of the oscillated light leakage $L_{LEAK}$ detected in the example 1 was 0.5% or less of the intensity of the returned light having 1064 nm detected in the comparison example. Specifically, it was confirmed that the light-transmissive-reflective film 5 reflects 99.5% of the oscillated light leakage $L_{LEAK}$, and thus the oscillated light leakage $L_{LEAK}$ to the excitation light source 1 was suppressed.

Figure 3B:
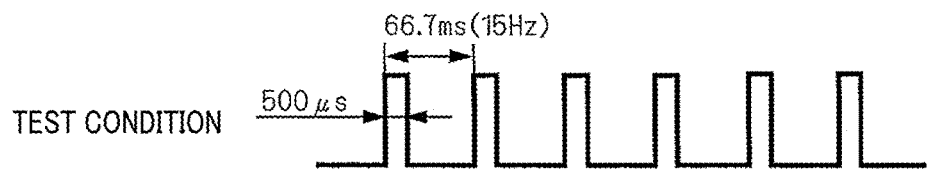
FIG. 3B is a characteristics diagram showing conditions of a durability test.

Further, 10.5 amps of current (corresponding to 81 mJ of light energy) was supplied in pulse form to the semiconductor laser module 100 with a condition shown in FIG. 3B so as to drive the semiconductor laser module 100. Then, a durability test was performed for the example 1 and the comparative example.

Figure 3C:
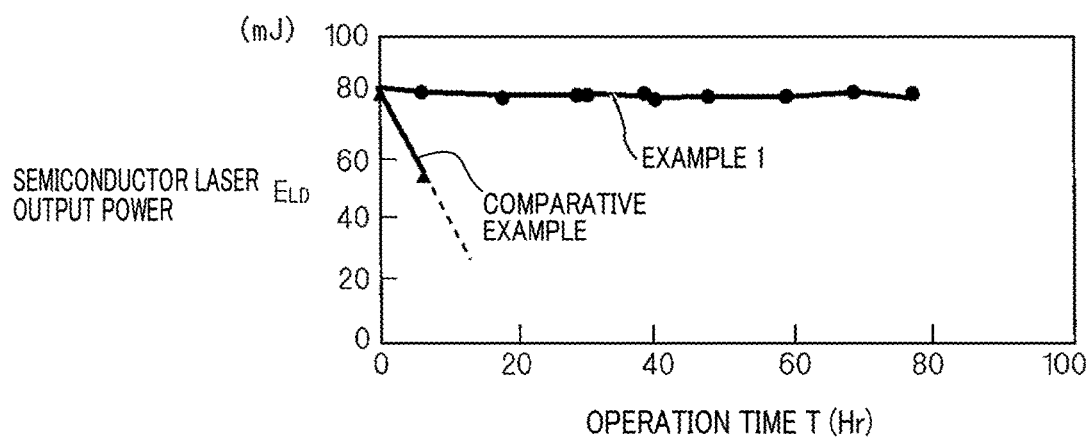
FIG. 3C is a characteristics diagram showing effects of improvement of durability according to the present embodiment together with a comparative example.

The result is shown in FIG. 3C. In the comparative example, the output power of the semiconductor laser module 100 is decreased to 30% within several hours.

On the other hand, according to the example 1, despite continuous driving for several tens of hours, the output power is not decreased at all.

Figure 4A:
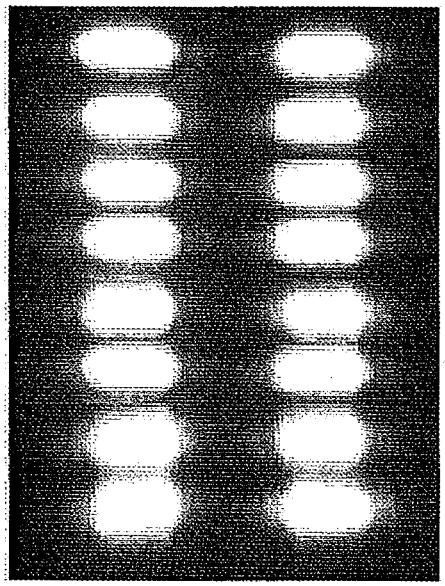
FIG. 4A is a picture in place of a drawing, showing a state of a light-emission emitter after the durability test is applied in the embodiment.
Figure 4B:
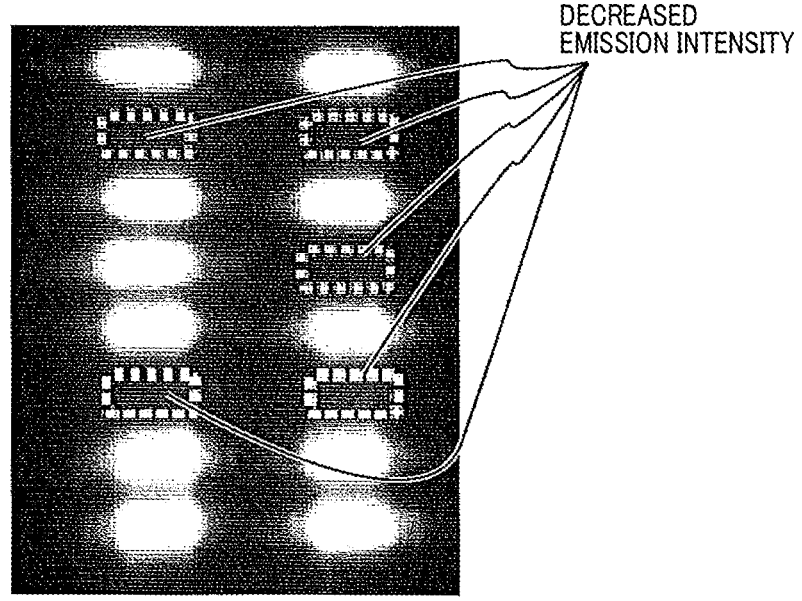
FIG. 4B is a picture in place of a drawing, showing a state of damage of a light-emission emitter after the durability test is applied in a comparative example.

After the durability test, the semiconductor laser modules 100 used for the example 1 and the comparative example were checked. As shown in FIG. 4A, according to the example 1, every light-emission emitter operated properly. However, as shown in FIG. 4B, according to the comparative example, damage was confirmed on light-emission emitters at specific locations.

Figure 4C:
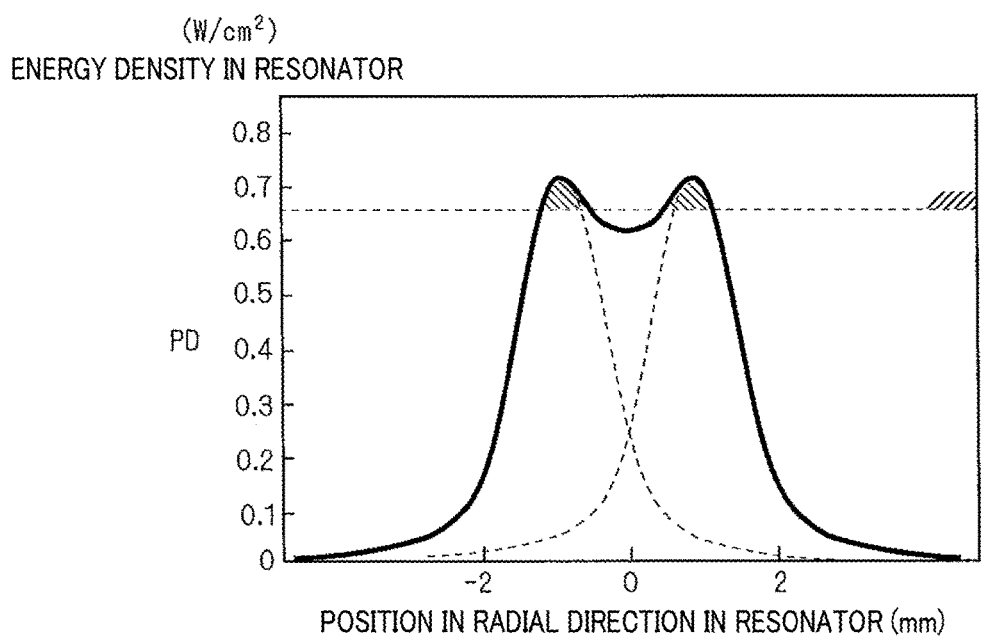
FIG. 4C is a characteristics diagram showing an energy density in a laser resonator.

As shown in FIG. 4C, an energy distribution of the laser resonator 3 shows Gaussian like distribution, and having two peaks. It was found that high energy distribution was observed in a specific range.

Figure 4D:
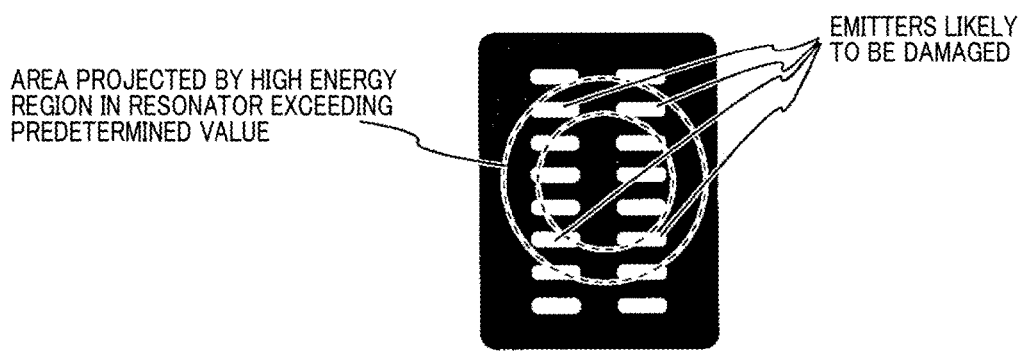
FIG. 4D is an overlay diagram in which an area having a specific energy density in a conventional laser resonator, and locations where the light-emission emitters are often damaged, are overlaid.
Figure 5A:
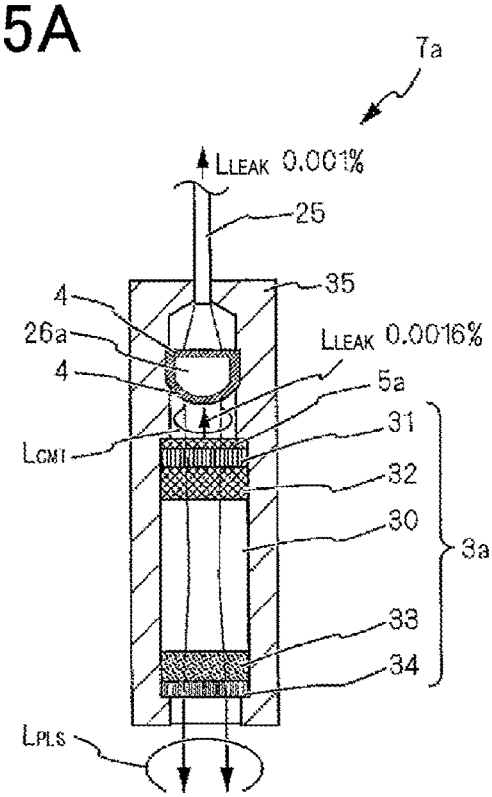
FIG. 5A is a cross sectional view showing a major portion of a laser ignition device according to a second embodiment.
Figure 5B:
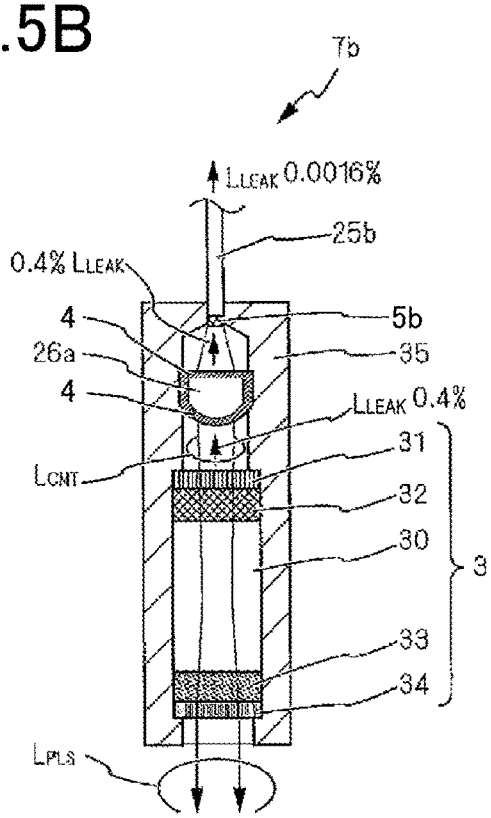
FIG. 5B is a cross sectional view showing a major portion of a laser ignition device according to a third embodiment.
Figure 5C:
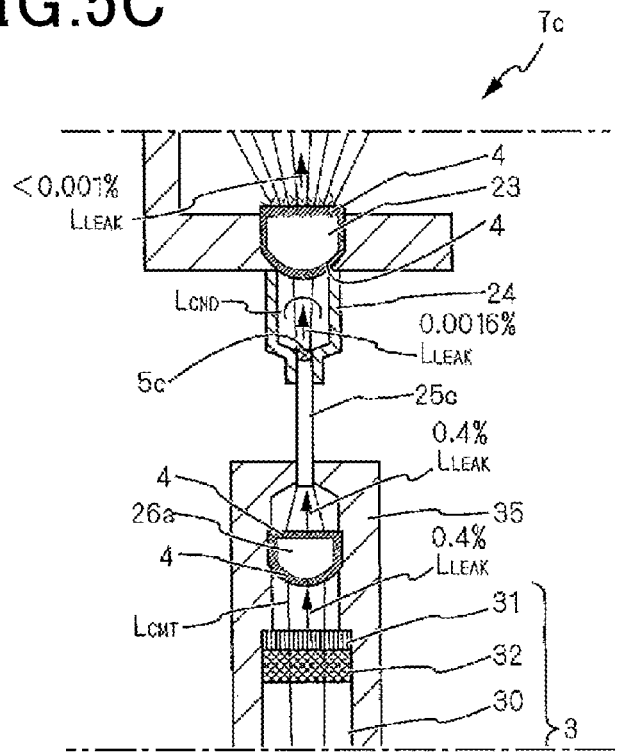
FIG. 5C is a cross sectional view showing a major portion of a laser ignition device according to a fourth embodiment.
Figure 5D:
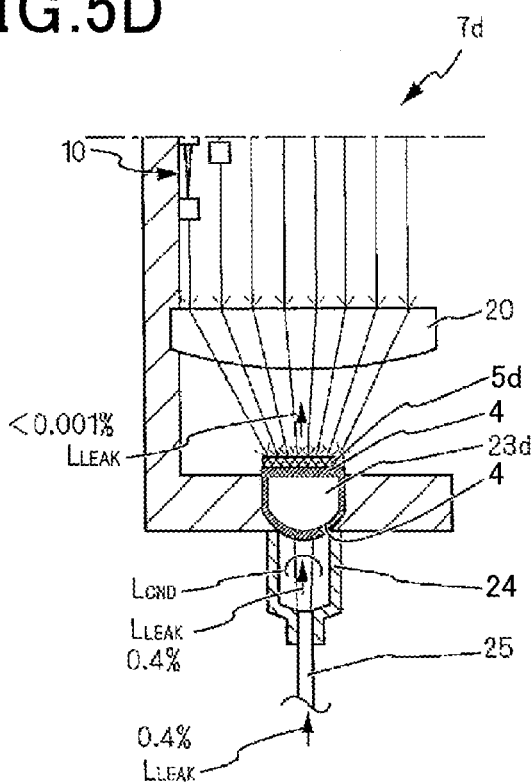
FIG. 5D is a cross sectional view showing a major portion of a laser ignition device according to a fifth embodiment.
Figure 5E:
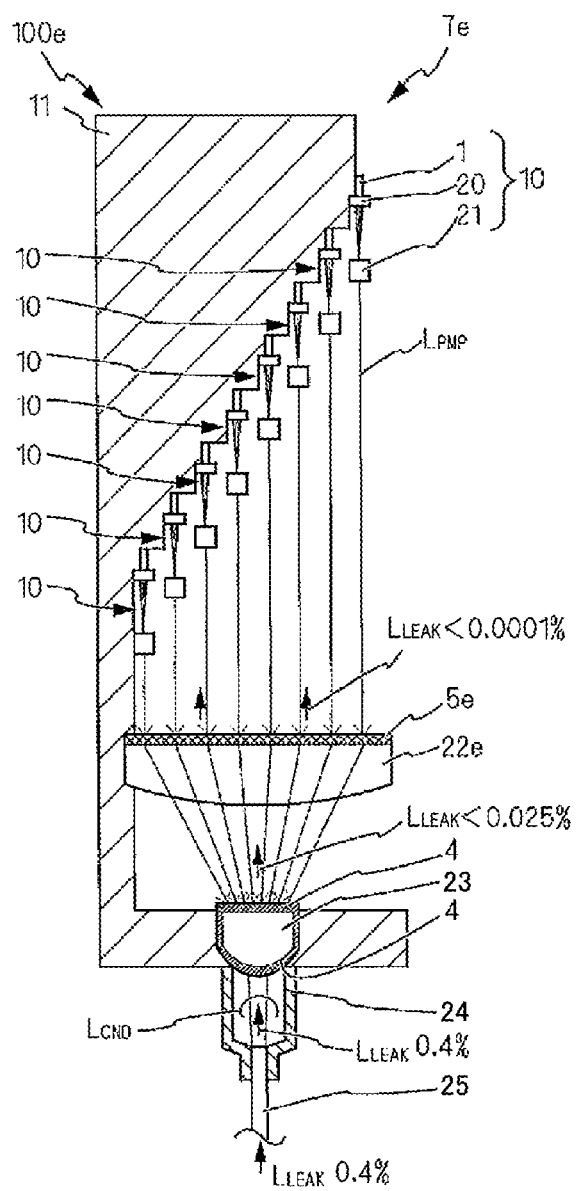
FIG. 5E is a cross sectional view showing a major portion of a laser ignition device according to a sixth embodiment.
Figure 5F:
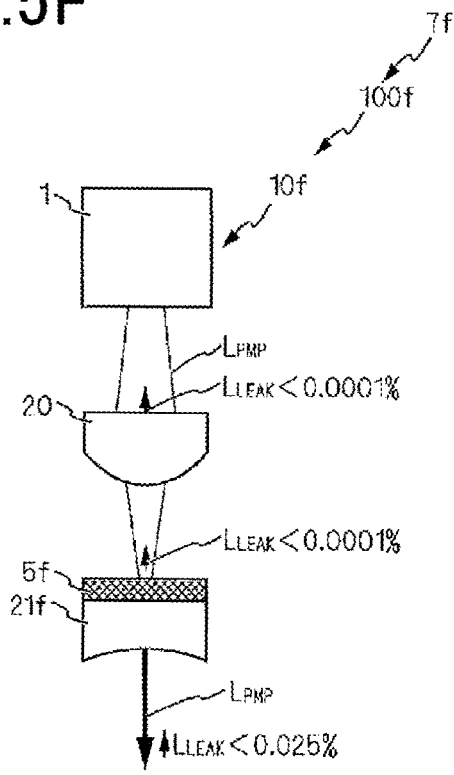
FIG. 5F is a cross sectional view showing a major portion of a laser ignition device according to a seventh embodiment.
Figure 5G:
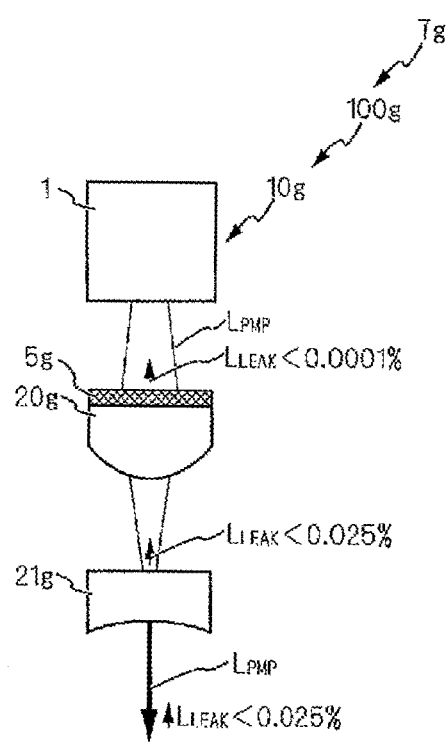
FIG. 5G is a cross sectional view showing a major portion of a laser ignition device according to an eighth embodiment.

As shown in FIG. 4D, with respect to the energy distribution, when a region exceeding a specific energy in the cross-sectional direction is projected on an area of the light-emission emitters of the semiconductor laser module 100, it was found that an area where the energy density exceeding a prescribed value corresponds to locations of the light-emission emitters, which are likely to be damaged.

Accordingly, even if the light-transmissive-reflective film 5 is disposed exclusively at a location having high energy density of the returned light leak $L_{LEAK}$, effects thereof can be obtained.

With reference to FIGS. 5A, 5B, 5C, 5D, 5E, 5F and 5G, other embodiments will be described.

In the following embodiments, the basic configuration is the same as the one of the above-described first embodiment. However, as the major portions of the present embodiments, only the dispositions of the light-transmissive-reflective films (5a-5g) are modified.

Therefore, since the same reference symbols are added to the same configurations as the above-described embodiment, and branch numbers of alphabet characters a to g are added to characteristic portions in each of the embodiments, explanations for common parts are omitted, but only the characteristic portions will be described.

Moreover, any two embodiments among the first embodiment to the eighth embodiment can be combined to implement them.

In the laser ignition device 7a according to a second embodiment, the light-transmissive-reflective film 5 is not provided for the collimating lens 26a, but provided at the end surface in the incident side of the laser resonator 3a.

Even with this configuration, oscillated light leakage $L_{LEAK}$ leaked from the laser resonator 3a corresponding to 0.4% of intensity of the oscillated light $L_{PLS}$, and further 0.4% of this light leakage $L_{LEAK}$, i.e., only 0.0016% of the intensity of the oscillated light $L_{PLS}$ is propagated to the excitation light source side. Therefore, similar effects of the above-described embodiments can be obtained.

It should be noted that the light-transmissive-reflective film 5 may be provided on the collimating lens 26 similar to the above-described first embodiment, and a light-transmissive-reflective film 5a may be further provided on the end surface of the incident side of the laser resonator 3a, the light-transmissive-reflective film 5 and the light-transmissive-reflective film 5a being overlapped from each other.

However, when the light-transmissive-reflective film 5 and the light-transmissive-reflective film 5a are provided being overlapped from each other, the intensity of the oscillated light leakage $L_{LEAK}$ reaching the excitation light source 1 becomes substantially 0. Hence, assuming the light-transmissive-reflective films 5 are provided to be further overlapped with each other, the transmittance $T_{PMP}$ of the excitation light $L_{PMP}$ will be rather decreased. Accordingly, additional light-transmissive-reflective films 5 are not necessary.

In the laser ignition device 7b according to a third embodiment, a light-transmissive-reflective film 5b is formed on the emission surface of the optical fiber 25b.

According to the present embodiment, the oscillated light leakage $L_{LEAK}$ is reciprocally transmitted between the light-transmissive-reflective film 5b and the laser resonator 3. Therefore, similar effects as the above-described embodiments can be obtained.

In the laser ignition device 7c according to a fourth embodiment, a light-transmissive-reflective film 5c is formed on the end surface in the incident surface side of the optical fiber 25c.

According to the present embodiment, the light leakage $L_{LEAK}$ is reciprocally transmitted between the light-transmissive-reflective film 5c and the laser resonator 3. Therefore, similar effects of the above-described embodiments can be obtained.

Further, in the present embodiment and the following embodiments, since the oscillated light leakage $L_{LEAK}$ leaked from the resonator 3 is transmitted to the optical fiber 25 and 25c, by providing an oscillated light leakage detection unit 9 shown in FIG. 2, the intensity of the oscillated light leakage $L_{LEAK}$ is detected, and the detected result can be used for detecting a combustion failure or the like in the internal combustion engine.

In the laser ignition device 7d according to a fifth embodiment, a light-transmissive-reflective film 5d is formed on the end surface in the incident surface side of a condensing lens 23d.

According to the present embodiment, the oscillated light leakage $L_{LEAK}$ is reciprocally transmitted between the light-transmissive-reflective film 5d and the laser resonator 3. Therefore, similar effects to the above-described embodiments can be obtained.

In the laser ignition device 7e according to a sixth embodiment, a light-transmissive-reflective film 5e is formed on the end surface in the incident surface side of a condensing lens 22e.

According to the present embodiment, the oscillated light leakage $L_{LEAK}$ is reciprocally transmitted between the light-transmissive-reflective film 5e and the laser resonator 3. Therefore, similar effects to the above-described embodiments can be obtained.

In the laser ignition device 7f according to a seventh embodiment, a light-transmissive-reflective film 5f is formed on the end surface in the incident surface side of a collimating lens 21f.

According to the present embodiment, the oscillated light leakage $L_{LEAK}$ is reciprocally transmitted between the light-transmissive-reflective film 5f and the laser resonator 3. Therefore, similar effects to the above-described embodiments can be obtained.

In the laser ignition device 7g according to an eighth embodiment, a light-transmissive-reflective film 5g is formed on the end surface in the incident surface side of a collimating lens 20g.

According to the present embodiment, the oscillated light leakage $L_{LEAK}$ is reciprocally transmitted between the light-transmissive-reflective film 5g and the laser resonator 3. Therefore, similar effects to the above-described embodiments can be obtained.

With reference to FIG. 6, an overall configuration of the laser ignition devices 7, 7a-7g will be described.

The laser ignition devices 7, 7a-7g are provided for respective cylinders of the internal combustion engine 8, including the condensing means 6 fixed to an engine head 81, and the excitation light source 1, the optical elements 2 (20-26), 2a (20-26a)-2g (20g-26) and the laser resonators 3 and 3a which are described in the above-described first to eighth embodiments.

The condensing means 6 is configured of an oscillated light expansion lens 60 that emits expansion light $L_{EXP}$ in which the oscillated light $L_{PLS}$ oscillated by the laser resonators 3 and 3a is expanded, a condenser lens 61 that condenses the expansion light $L_{EXP}$ and emits the condensed light $L_{FCS}$ to be condensed to a predetermined focused point FP in the combustion chamber 80, a protective glass 62 that protects the condensing lens 61 from a pressure and temperature or the like of the combustion chamber 80, an oscillated light expansion lens 60, and a housing 63 that fixes the condensing lens 61 and the protective glass 62 to the engine head 81.

The oscillated light $L_{PLS}$ oscillated by the laser resonators 3 and 3a is once expanded by the condensing means 6 and condensed to the predetermined focused point again, whereby the energy density can be extremely high so as to ignite the air-fuel mixture introduced in the combustion chamber 80.

According to the present embodiment, the intensity of the oscillated light leakage $L_{LEAK}$ transmitted to the excitation light source 1 can be significantly reduced between the laser resonators 3 and 3a, and the light-transmissive-reflective films 5, 5a to 5g. Accordingly, the excitation light source 1 is prevented from being damaged by the oscillated light leakage $L_{LEAK}$, and the laser ignition devices 7, 7a to 7g achieves stable ignition operation.

REFERENCE SIGNS LIST

1: excitation light source
10: semiconductor laser module
11: semiconductor laser fixing member
100: semiconductor laser array
2: optical element
20, 21: cylindrical lens
22, 23: condensing lens
24: excitation light coupling element
25: optical fiber
26: excitation light collimating lens
3: laser resonator
30: laser medium
31: antireflection coating
32: totally reflection mirror
33: saturable absorber
34: partial reflection film
35: resonator accommodating housing
5: light-transmissive-reflective film
50: high refractive index film
51: low refractive index film
6: oscillated light condensing means
60: oscillated light expansion element (beam expander)
61: condenser lens
62: protective glass
7: laser ignition device
8: internal combustion engine
80: combustion chamber
81: engine head
9: oscillated light leakage detection unit
90: beam splitter for sampling oscillated light leakage
91: optical fiber
92: light detection unit (photo detector)
$L_{PMP}$: excitation light
$L_{CND}$: convergent light
$L_{CLM}$: parallel light
$L_{PLS}$: excitation light
$L_{LEAK}$: oscillated light leakage
$L_{EXP}$: expansion light
$L_{FCS}$: condensed light
FP: focused point
$\lambda_{PMP}$: excitation light wavelength
$\lambda_{PLS}$: oscillated light wavelength
$R_{PMP}$: excitation light reflectance
$T_{PMP}$: excitation light transmittance
$R_{LEAK}$: oscillated light leakage reflectance
$T_{LEAK}$: oscillated light leakage transmittance
$I_{PLS}$: oscillated light intensity
$I_{LEAK}$: oscillated light leakage intensity
$n_H$: refractive index of high refractive index film
$n_L$: refractive index of low refractive index film
$n_0$: refractive index of air
$n_M$: refractive index of optical element

The invention claimed is:

1. A laser ignition device that ignites an air-fuel mixture introduced into a combustion chamber of an internal combustion engine by condensing oscillated light having high energy density, the laser ignition device comprising:
   an excitation light source that emits coherent excitation light;
   a laser resonator that oscillates oscillated light having high energy density by being irradiated with the excitation light; and
   condensing means that condenses the oscillated light oscillated by the laser resonator,
   wherein:
   a collimate lens is provided between the excitation light source and the laser resonator, the collimate lens modulating the excitation light transmitted from the excitation light source to be incident light of the laser resonator, the collimate lens including an end surface having a plane shape on an incident side where the excitation light is on incident;
   a light-transmissive-reflective film is provided between the excitation light source and the laser resonator, the light-transmissive-reflective film permeating the excitation light having short wavelength and reflecting oscillated light leakage leaked from the laser resonator to an excitation light source side, the oscillated light leakage being a part of the oscillated light having long wavelength; and
   the light-transmissive-reflective film is disposed on the end surface having the plane shape of the collimate lens and/or an end surface having a plane shape on an incident side the laser resonator.

2. The laser ignition device according to claim 1, wherein: the light-transmissive-reflective film is a multi-layered film in which a low refractive index film and a high refractive film are laminated alternately, a refractive index of the low refractive index film being lower than that of an optical material composing an optical element or the laser resonator, and a refractive index of the high refractive index film being higher than that of the optical material; and the low refractive index film is made of a dielectric substance selected from $SiO_2$ and $MgF_2$, and the high refractive index film is made of a dielectric substance selected from $TiO_2$ and $Ta_2O_5$.

3. The laser ignition device according to claim 2, wherein:

the light-transmissive-reflective film is formed in which a high refractive index film made of $Ta_2O_2$ having high refractive index ($n_H$=2.16) and a low refractive index film made of $SiO_2$ having low refractive index ($n_L$=1.41) are laminated alternately to form a 19-layered film comprised of 19 layers.

4. The laser ignition device according to claim 1, wherein:

a plurality of excitation light sources are provided;

the device further includes a laser array that condenses excitation light emitted from the plurality of excitation light sources and outputs condensed light; and the collimate lens modulates the condensed light outputted by the laser array to be incident light of the laser resonator.

5. A laser ignition device that ignites an air-fuel mixture introduced into a combustion chamber of an internal combustion engine by condensing oscillated light having high energy density, the laser ignition device comprising:

an excitation light source that emits coherent excitation light;

a condense lens that transmits the excitation light transmitted from the excitation light source to an optical fiber;

a collimate lens that collimates the excitation light transmitted by the optical fiber;

a laser resonator that oscillates oscillated light having high energy density by being irradiated with the excitation light collimated by the collimate lens; and condensing means that condenses the oscillated light oscillated by the laser resonator, wherein:

the collimate lens includes an end surface having a plane shape on an incident side where the excitation light is on incident;

a light-transmissive-reflective film is provided between the excitation light source and the laser resonator, the light-transmissive-reflective film permeating the excitation light having short wavelength and reflecting oscillated light leakage leaked from the laser resonator to an excitation light source side, the oscillated light leakage being a part of the oscillated light having long wavelength; and the light-transmissive-reflective film is disposed on at least one of:

the end surface of the collimate lens having the plane shape;

an end surface having a plane shape in a laser resonator side of the optical fiber; and an end surface having a plane shape in an incident side of the laser resonator.

6. The laser ignition device according to claim 5, wherein:

a plurality of excitation light sources are provided;

the device includes a laser array that condenses excitation light emitted from the plurality of excitation light sources and outputs the excitation light; and the optical fiber transmits the condensed excitation light outputted by the laser array to the collimate lens.

7. The laser ignition device according to claim 5, wherein:

a plurality of excitation light sources are provided;

the device further includes a laser array that condenses excitation light emitted from the plurality of excitation light sources and outputs condensed light; and the collimate lens modulates the condensed light outputted by the laser array to be incident light of the laser resonator.

* * * * *

UNITED STATES PATENT AND TRADEMARK OFFICE
CERTIFICATE OF CORRECTION

PATENT NO. : 10,090,630 B2
APPLICATION NO. : 15/123327
DATED : October 2, 2018
INVENTOR(S) : Kanehara et al.

Page 1 of 1

It is certified that error appears in the above-identified patent and that said Letters Patent is hereby corrected as shown below:

In the Claims

At Column 13, Line 13, should read:
... high refractive index film made of $Ta_2O_5$ having high ...

Signed and Sealed this
First Day of January, 2019

Andrei Iancu
*Director of the United States Patent and Trademark Office*